(12) United States Patent
DeLuca (10) Patent No.: US 7,308,185 B2
(45) Date of Patent: Dec. 11, 2007

(54) ULTRA-THIN HIGH-PRECISION GLASS OPTIC

(75) Inventor: Nicholas A. DeLuca, Stratford, CT (US)

(73) Assignee: ASML Holding N.V., Veldhoven (NL)

( * ) Notice: Subject to any disclaimer, the term of this patent is extended or adjusted under 35 U.S.C. 154(b) by 258 days.

(21) Appl. No.: 11/009,705

(22) Filed: Dec. 13, 2004

(65) Prior Publication Data

US 2006/0127779 A1    Jun. 15, 2006

(51) Int. Cl.
*G02B 6/00* (2006.01)
(52) U.S. Cl. .......................................... 385/140; 398/85
(58) Field of Classification Search ................ 385/140; 398/85
See application file for complete search history.

(56) References Cited

U.S. PATENT DOCUMENTS 6,778,337 B2 * 8/2004 Aoki et al. ................. 359/738

2003/0022070 A1 * 1/2003 Lee et al. ...................... 430/5

* cited by examiner

*Primary Examiner*—Frank G. Font
*Assistant Examiner*—Derek L. Dupuis
(74) *Attorney, Agent, or Firm*—Sterne, Kessler, Goldstein & Fox P.L.L.C.

(57) ABSTRACT

The present invention provides an ultra-thin high-precision glass optic and method of manufacturing the same. The optic has an axial thickness that is less than 1,000 microns. A pattern and/or coating is disposed on a surface of the optic to provide attenuation of light in an optical system. In an embodiment, the optic is manufactured by disposing a pattern on a surface of a reticle. The pattern is covered with a first protective coating to protect the pattern. Individual optics are cut from the reticle so that each optic includes a portion of the pattern. The optic is thinned by removing material until it has an axial thickness of less than 1,000 microns. The optic is cleaned after thinning and covered with an anti-reflective coating.

13 Claims, 9 Drawing Sheets

ULTRA-THIN HIGH-PRECISION GLASS OPTIC

FIELD OF THE INVENTION

The present invention relates to ultra-thin high-precision glass optics for use, for example, in photolithography tools, and methods of manufacturing ultra-thin high-precision glass optics.

BACKGROUND OF THE INVENTION

Photolithography systems/tools are used to print features on a substrate in a variety of manufacturing applications. Typically, in operation, a reticle having patterned features is exposed by an illumination source such as, for example, a laser to form images of the features. An optical system projects images of the features onto the substrate.

Conventional photolithography systems control the amount of illumination light that reaches the substrate, for example, by light beam alignment, homogenizers, mechanical trimming, and/or diffractive elements. These conventional techniques disrupt the quality of light that reaches the substrate.

What is needed is a means for attenuating light in a photolithography system, as well as other optical systems, that does not disturb the quality of light.

SUMMARY OF THE INVENTION

The present invention provides an ultra-thin high-precision glass optic and method of manufacturing the same. It also provides an attenuation system that includes the ultra-thin high-precision glass optic, which is useful for example in photolithography systems/tools.

The ultra-thin high-precision glass optic has an axial thickness that is less than 1,000 microns. A pattern and/or coating is disposed on a surface of the glass optic to provide controlled attenuation of light intensity in an optical system. In one embodiment, the glass optic has a pattern disposed on a first surface that attenuates light. An optional anti-reflective coating covers the patterned surface and/or a second parallel surface. In another embodiment, the glass optic has a dielectric coating rather than the pattern on the first surface that attenuates light. It is a feature of the glass optic that it minimizes secondary effects of aberrations, focal shift, black border effects, scattered light, et cetera.

The pattern comprises geometric shapes such as, for example, squares, dots, gratings et cetera that randomly or pseudo-randomly cover the surface. The pattern can be formed, for example, using chrome. Alternatively, a dielectric coating can be used in place of the pattern. In embodiments, the pattern or dielectric coating attenuates incident light between five percent and twenty-five percent per unit area. Other attenuation factors can also be achieved.

An optional anti-reflective coating covers the patterned surface and/or a second parallel surface through which light exits the glass optic. The coating improves light transmission through the glass optic by about four to seven percent for each surface coated.

In an embodiment, the ultra-thin high-precision glass optic is manufactured by disposing a pattern on a surface of an optical blank or reticle. The patterned surface is coated with a covering to protect the pattern and glass optic. Individual glass optics are cut from the optical blank so that each optical element includes a portion of the pattern. The glass optic is thinned by removing material from the glass optic until it has an axial thickness of less than 1,000 microns. The glass optic is cleaned after thinning and coated with an optional anti-reflective covering. During selected steps, wax may be used to fixture the optical blank and/or optical elements.

In a non-patterned embodiment, the ultra-thin high-precision glass optic is manufactured by coating a first surface of the optical blank or reticle with a protective covering. Individual glass optics are cut from the optical blank. The glass optic is thinned by removing material from the uncoated surface of the glass optic until it has an axial thickness of less than 1,000 microns. The glass optic is cleaned after thinning and covered with a dielectric coating on the first surface. An optional anti-reflective coating is applied to the surface through which light exits the glass optic.

Further embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

The present invention provides an ultra-thin high-precision glass optic and method of manufacturing the same. It also provides an attenuation system that includes the ultra-thin high-precision glass optic, which is useful for example in photolithography systems/tools. While specific configurations and arrangements are discussed, it should be understood that this is done for illustrative purposes only. Persons skilled in the art(s) will recognize that other configurations and arrangements can be used without departing from the spirit and scope of the present invention. It will be apparent to persons skilled in the pertinent art(s) that this invention can be employed in a variety of other applications.

Figure 1:
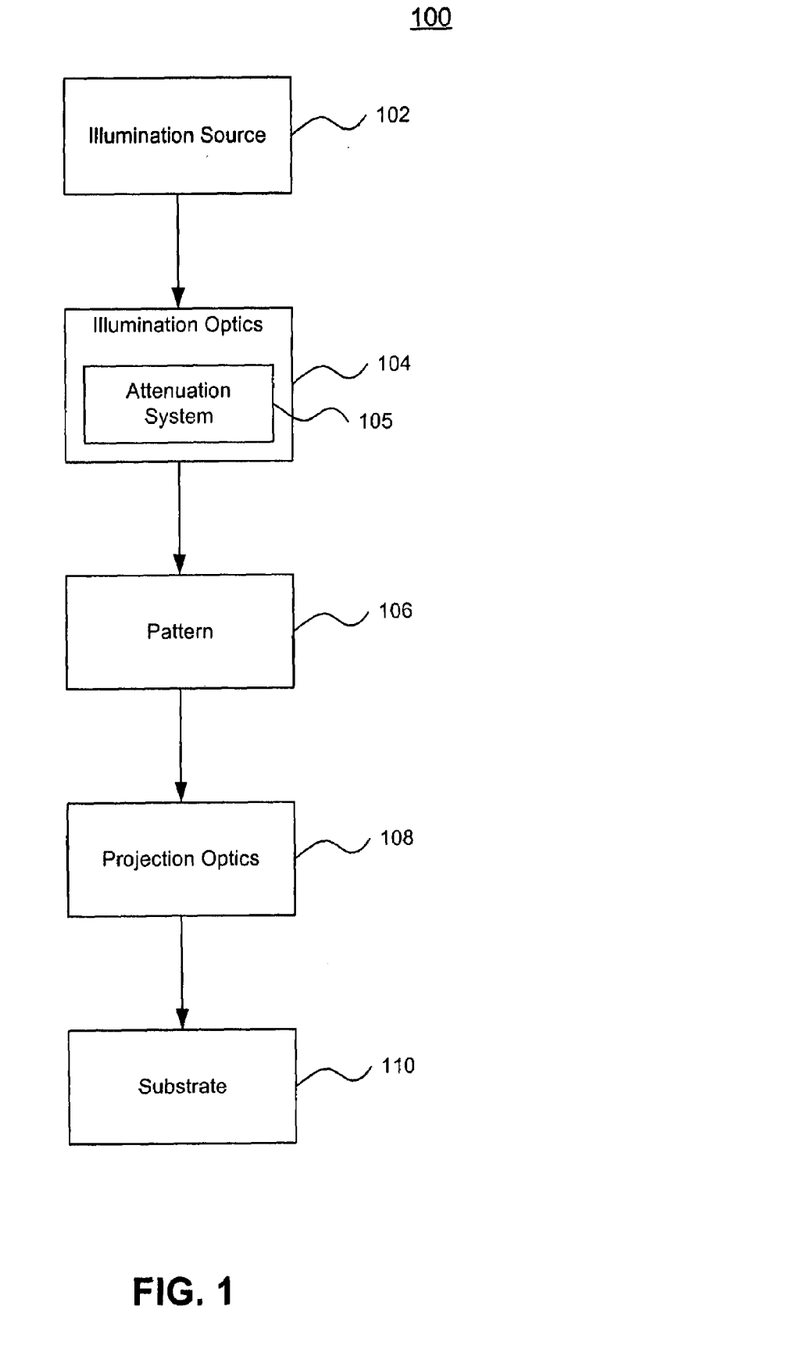
FIG. 1 is a schematic diagram of a photolithography system that includes an attenuation system having ultra-thin high-precision glass optics.

FIG. 1 is a schematic diagram of an example photolithography system 100 that includes an attenuation system having ultra-thin high-precision glass optics according to an embodiment of the present invention. Photolithography system 100 includes an illumination source 102, illumination optics 104, a pattern 106, projection optics 108, and a substrate 110.

Illumination source 102 can be any source that emits light, including ultraviolet light. In an embodiment, illumination source 102 is a laser. Light emitted from illumination source 102 enters illumination optics 104.

Illumination optics 104 condition the light emitted by illumination source 102. Various optical elements that can be used to condition light such as, for example, diffusing optics, grating optics et cetera are known in the relevant art(s).

Illumination optics 104 also include an attenuation system 105. Attenuation system 105 has multiple ultra-thin high-precision glass optics that attenuate light without disturbing its quality. Attenuation systems according to the present invention are described in more detail below with reference to FIGS. 2-5.

Pattern 106 is typically a reticle that has a chrome pattern disposed on it or a spatial light modulator that produces a pattern. In the case of a reticle, light from illumination optics 104 passes through the reticle and reproduces the pattern disposed on the reticle on substrate 110. In the case of a spatial light modulator, light is reflected, for example, off of mirrors to produce a desired pattern on substrate 110.

Projection optics 108 focus the light from pattern 106 onto substrate 110. In an embodiment, projection optics 108 also reduce the size of pattern 106 in the process of focusing the light on substrate 110.

FIGS. 2A-D are schematic diagrams that illustrate various embodiments of an attenuation system having ultra-thin high-precision glass optics. These embodiments can be used with photolithography system 100.

Figure 2A:
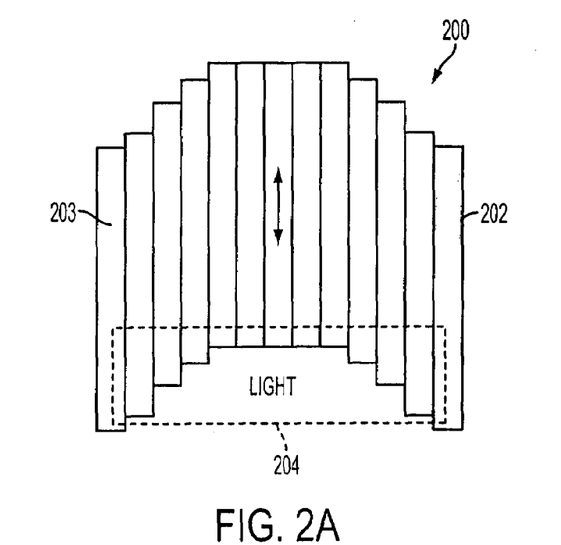
FIGS. 2A-D are schematic diagrams of attenuation systems that illustrate the ultra-thin high-precision glass optics.

FIG. 2A is a schematic diagram of an attenuation system 200. Attenuation system 200 includes several ultra-thin high-precision glass optics 202 that extend into a light path or light beam 204. Each of the ultra-thin high-precision glass optics 202 has an axial thickness that is less than 1,000 microns. In embodiments, the axial thickness is on the order of 0.500 mm, 0.300 mm, 0.200 mm, 0.150 mm, and 0.100 mm.

In one embodiment, a pattern is disposed on a surface 203 of each of the glass optics 202 to provide controlled attenuation of light passing through the glass optics 202. The amount of attenuation is determined by the pattern. An optional anti-reflective coating covers the patterned surface and/or the surface opposite the patterned surface through which light exits glass optic 202. In another embodiment, each glass optic 202 has a dielectric coating on surface 203, rather than the pattern, that attenuates light.

In the patterned embodiment, the pattern comprises geometric shapes such as, for example, squares, dots, gratings et cetera that randomly or pseudo-randomly cover surface 203. The pattern can be formed, for example, using chrome.

In an embodiment, each of the ultra-thin high-precision glass optics 202 of attenuation system 200 is movable in the plane containing the ultra-thin high-precision glass optics 202. The glass optics 202 are moved, for example, using actuators (not shown) coupled to the ultra-thin high-precision patterned coated glass optics 202. By appropriately positioning of the ultra-thin high-precision patterned coated glass optics 202, it is possible to optimize the uniformity of the light intensity that exposes substrate 110 without disturbing the light quality.

The glass optics of attenuation system 200 can be oriented for example either vertically, so that gravity acts perpendicular to the optical axis of each glass optic 202, or horizontally, so that gravity acts parallel to the optical axis of each glass optic 202.

More details regarding glass optics 202 are provided below with reference to FIGS. 3-4.

Figure 2B:
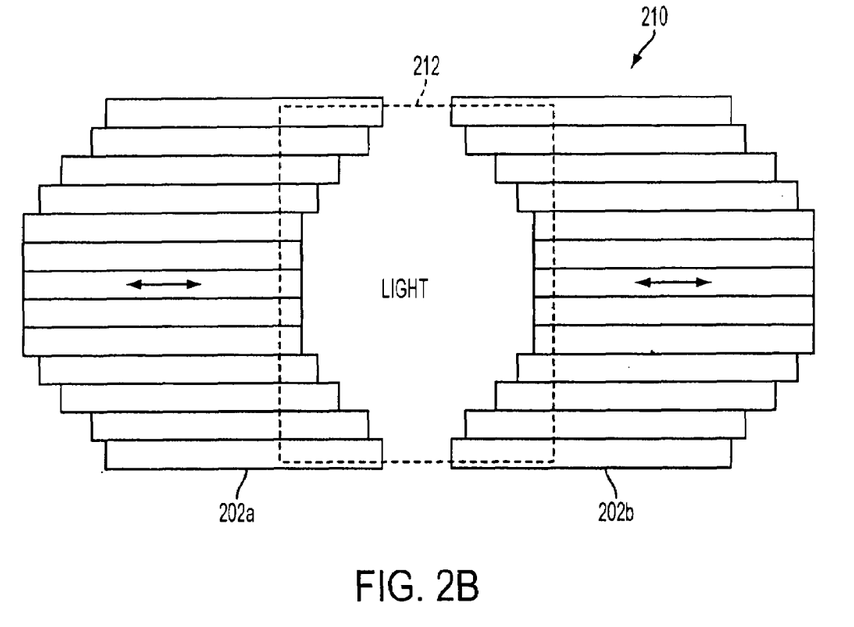

FIG. 2B is a schematic diagram of an attenuation system 210. The ultra-thin high-precision glass optics 202 of attenuation system 210 are separated into two groups 202a and 202b. As shown in FIG. 2B, the two groups 202a and 202b extend into light path 212 from opposite directions. In an embodiment, each of the ultra-thin high-precision glass optics 202 is movable in the plane containing the ultra-thin high-precision glass optics 202. The glass optics 202 can be moved either closer to the center of light path 212 or closer to an edge of light path 212 by actuators (not shown) coupled to the ultra-thin high-precision glass optics 202. In embodiments, attenuation system 210 is installed, exchanged, replaced and/or relocated in photolithography system 100 as a unit or separately. This is also the case for the other attenuation systems described herein.

Figure 2C:
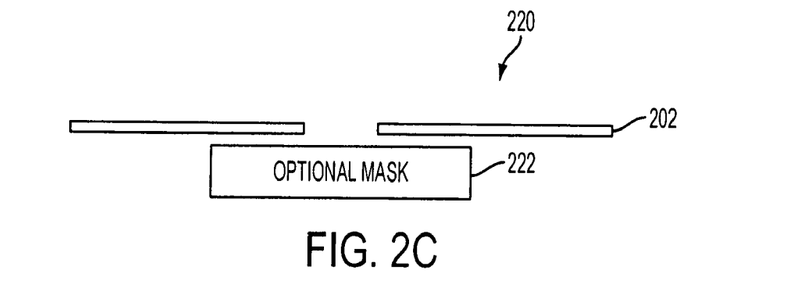
Figure 2D:
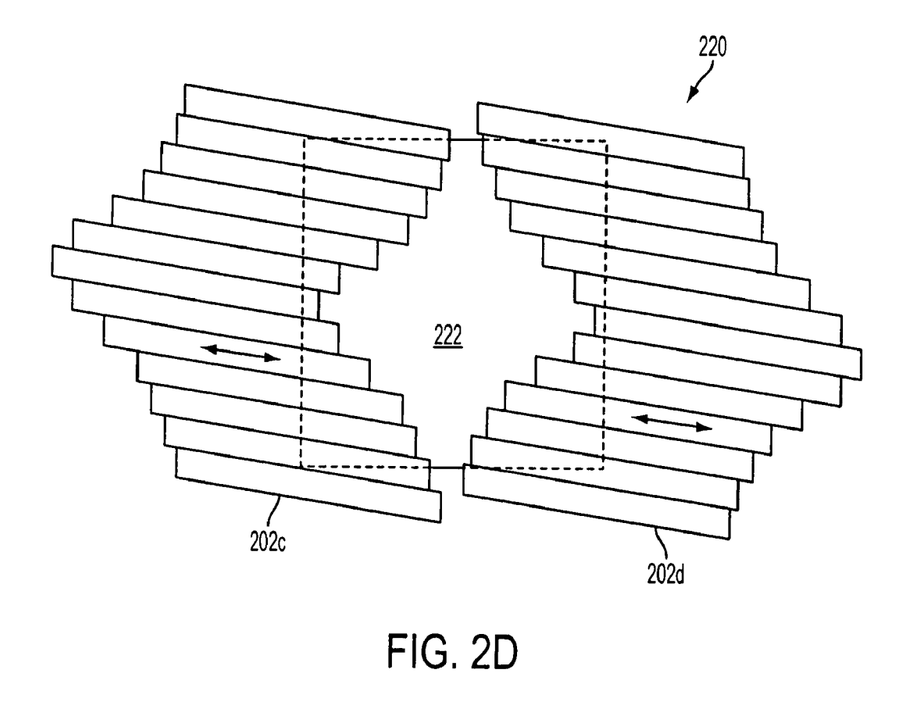

FIG. 2C is a schematic diagram of an attenuation system 220 that includes ultra-thin high-precision glass optics 202 and an optional mask 222. As shown in FIGS. 2C-D, the ultra-thin high-precision glass optics 202 are separated into two groups 202c and 202d. Each of the ultra-thin high-precision glass optics 202 that form a part of these two groups is cantilevered into the light path.

In an embodiment, each of the ultra-thin high-precision glass optics 202 of attenuation system 220 is movable in the plane containing the ultra-thin high-precision coated glass optics 202. The glass optics 202 can be moved either closer to the center of mask 204 or closer to an edge of mask 204, as illustrated in FIG. 2D, for example, either during mounting or optionally by actuators (not shown) coupled to the ultra-thin high-precision glass optics 202. By appropriately positioning of the glass optics 202, it is possible to optimize the uniformity of the light intensity that exposes substrate 110 without disturbing the light quality. In embodiments, attenuation system 220 is installed, exchanged, replaced and/or repositioned in an optical system, such as photolithography system 100, as a unit or separately.

Figure 3:
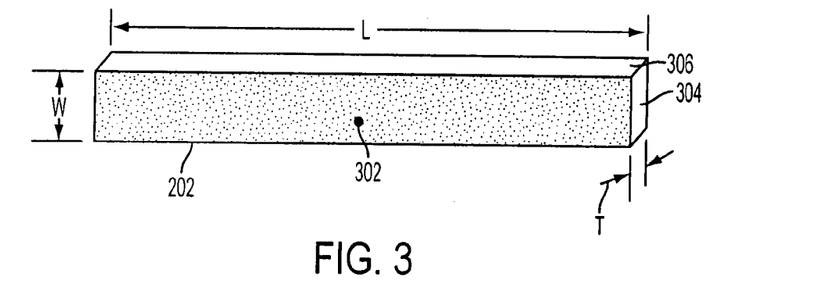
FIG. 3 is a schematic diagram of a single ultra-thin high-precision glass optic.

FIG. 3 is a schematic diagram of a single ultra-thin high-precision glass optic 202. As shown in FIG. 3, in an embodiment ultra-thin high-precision glass optic 202 has a length L, a width W, and a thickness T. The length L is selected so that glass optic 202 is sufficiently long enough to reach into an optical path of light to be attenuated. The width W is selected based on the frequency of light to be corrected. In embodiments, W is on the order of 4 mm, 8 mm, and 12 mm. The thickness T is less than 1,000 microns. In embodiments, T is on the order of 0.500 mm, 0.300 mm, 0.200 mm, 0.150 mm, and 0.100 mm. Due to the thinness of glass optic 202, ripples, shadows, and light scattering effects are reduced. Other embodiments have different dimensions and/or shapes.

In an embodiment, a short end 304 of ultra-thin high-precision glass optic 202 is perpendicular to its long end 306, as shown for example in FIG. 3 and FIGS. 2A-B. In other embodiments, short end 304 is not perpendicular to long end 306, so that the glass optics 202 can be oriented at an angle as shown in FIG. 2D. Orienting the glass optics 202 at an angle aids in controlling, for example, exposure of substrate 110 due to any gaps between adjacent glass optics 202, particularly in a step-and-scan type photolithography tool.

A surface 302 of ultra-thin high-precision glass optic 202 has a pattern or dielectric coating disposed on it that attenuates light. In embodiments, the attenuation is between five percent and twenty-five percent. Other amounts of attenuation can also be achieved by varying, for example, the number of geometric shapes of the pattern on surface 302 per unit area or the thickness of the dielectric coating on surface 302.

In patterned embodiments, the pattern is typically composed of several million geometrical shapes such as, for example, squares, dots, gratings et cetera randomly or pseudo-randomly (uniformly) distributed across surface 302. The geometrical shapes can vary in size. In one embodiment, for example, the pattern is formed using small square chrome islands approximately 1.0-50 microns in size.

Ultra-thin high-precision patterned coated glass optic 202 is optionally covered with an anti-reflective coating. In embodiments, the anti-reflective coating improves light transmission through glass optic 202 by about four to seven percent for each surface coated (i.e., coating both the surface where light enters glass optic 202 and the surface where light exits glass optic 202 will improve light transmission by about eight to fourteen percent.).

Figure 4:
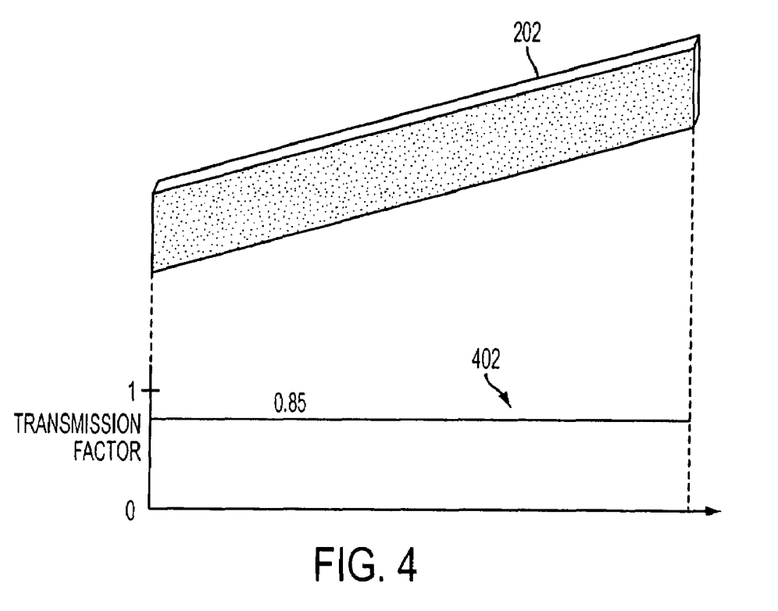
FIG. 4 is a schematic diagram illustrating the light transmission profile of an ultra-thin high-precision glass optic.

FIG. 4 is a schematic diagram illustrating an example light transmission profile 402 for an embodiment of ultra-thin high-precision patterned coated glass optic 202. In the embodiment shown, the transmission factor for the entire length of ultra-thin high-precision patterned coated glass optic 202 is 0.85. The amount of attenuation is thus fifteen percent. The value 0.85 is only an example value, and it is not intended to limit the present invention. Other embodiments of the present invention have other transmission profiles.

Figure 5:
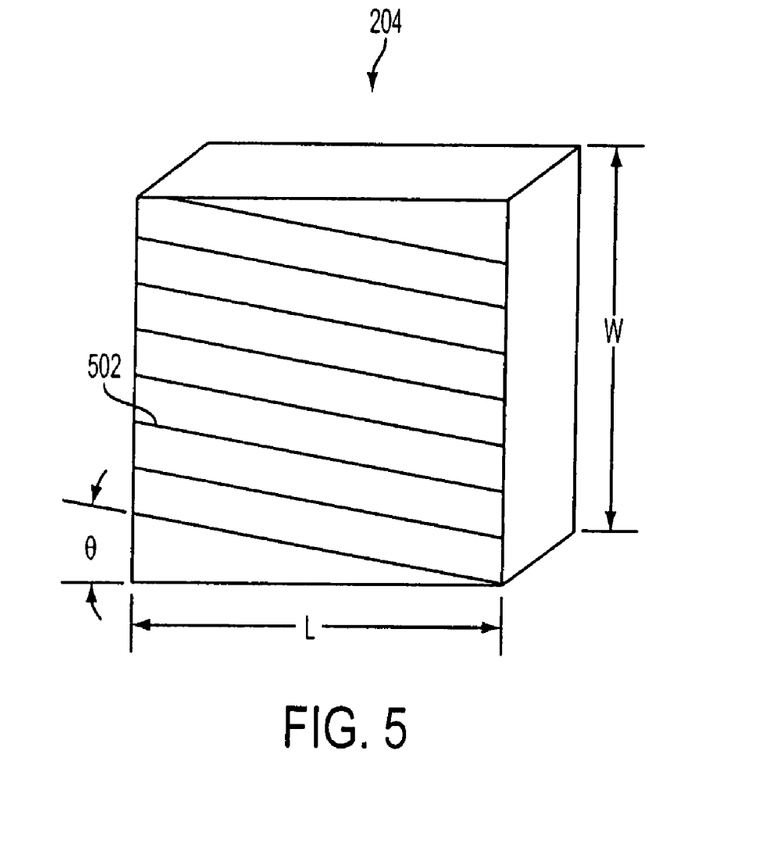
FIG. 5 is a schematic diagram of an optional mask for an attenuation system having ultra-thin high-precision glass optics.

FIG. 5 is a schematic diagram of optional mask 222. Optional mask 222 has a length L and a width W. The length and width of optional mask 222 are selected, for example, based on the illumination cross section present at pattern 106 (or reticle) of photolithography system 100.

A surface of optional mask 222 is covered with several chrome lines 502. Chrome lines 502 reduce non-uniformities at substrate 110 that can result from gaps between adjacent ultra-thin high-precision glass optics 202. Chrome lines 502 are oriented at an angle θ with respect to an edge of mask 222. The value of angle θ is selected to match the orientation of ultra-thin high-precision glass optics 202 (e.g., the chrome lines are positioned to block light passing between gaps in adjacent glass optics 202). In an embodiment, the angle θ shown in FIG. 5 is equal to zero. In other embodiments, angle θ is greater than zero.

Figure 6:
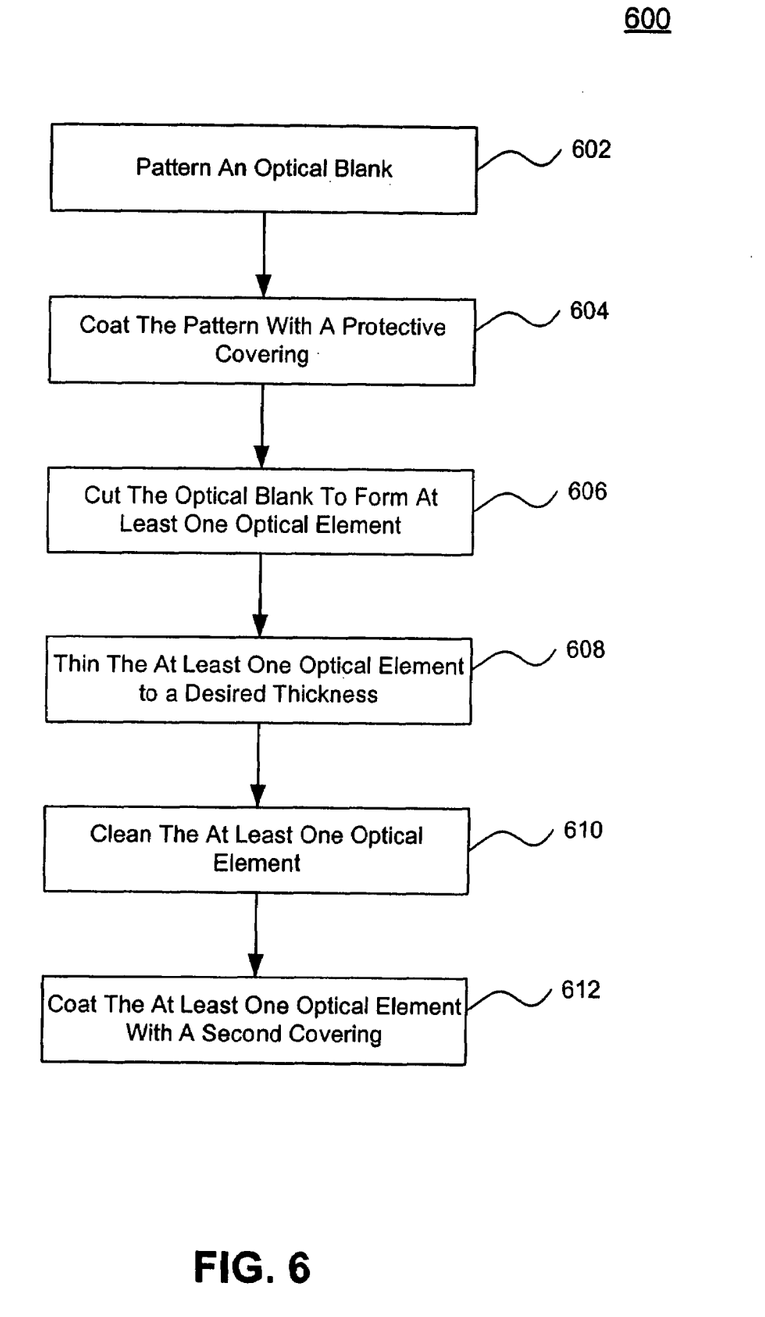
FIG. 6 is a flowchart of a method for manufacturing an ultra-thin high-precision glass optic.

FIG. 6 is a flowchart of a method 600 for manufacturing an ultra-thin high-precision glass optic according to an embodiment of the present invention. Method 600 has six steps.

In step 602, a pattern is disposed on an optical blank. In an embodiment, the pattern is composed of several million geometrical shapes such as, for example, squares, dots, gratings et cetera randomly or pseudo-randomly distributed across a surface of the optical blank. The sizes of the geometrical shapes can vary. In one embodiment, the pattern is formed using chrome and a conventional reticle manufacturing process. In embodiments, the number of geometric shapes of the pattern per unit area is varied to achieve a desired transmission or attenuation factor.

The optical blank can be any suitable glass optic such as, for example, commercially available reticles.

In step 604, the patterned side of the optical blank is covered with a thin protective coating. The purpose of this coating is to protect the pattern and glass from small chips and other debris produced during step 606. Any suitable coating that protects the pattern and glass, without harming it, can be used.

In step 606, the patterned optical blank is cut to form optical elements. This cutting step can be performed using any known cutting process such as, for example, saw cutting, machine grinding, hand grinding, milling, et cetera. Step 606 results in the production of optical elements having a desired shape and dimensions, except for axial thickness.

In step 608, the optical elements are thinned, for example, by grinding to a desired axial thickness of less than 1,000 microns. In embodiments, the optical elements are thinned for example to an axial thickness of 0.500 mm, 0.300 mm, 0.200 mm, 0.150 mm, or 0.100 mm.

In step 610, the optical elements are cleaned. This cleaning step preferably includes both mechanical cleaning and chemical cleaning. The cleaning should not interfere with the patterns on the optical elements and/or the glass surface.

In step 612, the optical elements are coated with an optional second coating. In embodiments, this optional coating is an optical coating such as, for example, an anti-reflective coating. As used herein, an optical coating refers to any coating intended to effect the optical properties of the optical elements. Optical coatings include, for example, coatings that stop light reflections at the glass surface or that block or facilitate the transmission of certain wavelengths of light.

As will be understood by persons skilled in the relevant art(s), method 600 can be used to manufacture optical elements that use a dielectric coating, rather than a pattern, to attenuate light with certain modifications. For example, when manufacturing optical elements that use a dielectric coating to attenuate light, step 602 is not performed. This is because such optical elements do not have a pattern. When manufacturing such optical elements, the dielectric coating that attenuates light is applied to the optical elements in step 612.

Figure 7A:
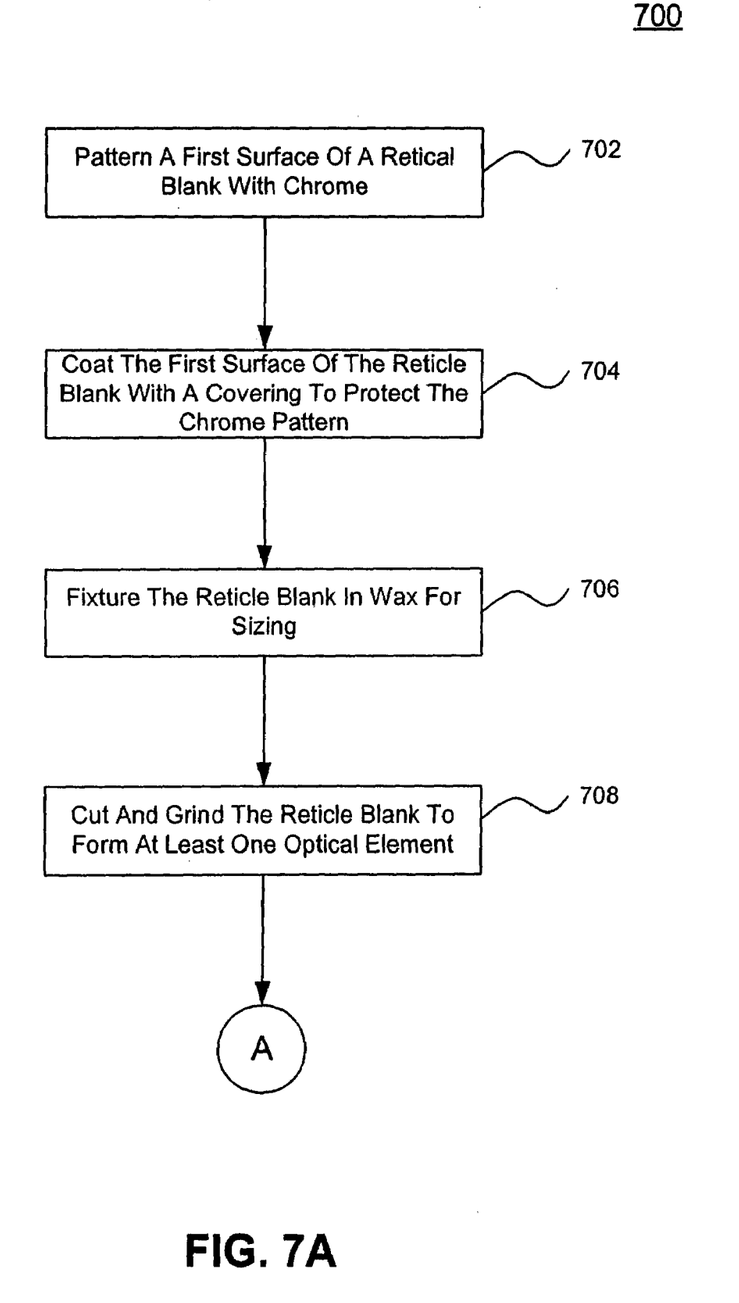
FIGS. 7A-B illustrate a flowchart of a more detailed method for manufacturing an ultra-thin high-precision patterned glass optic.
Figure 7B:
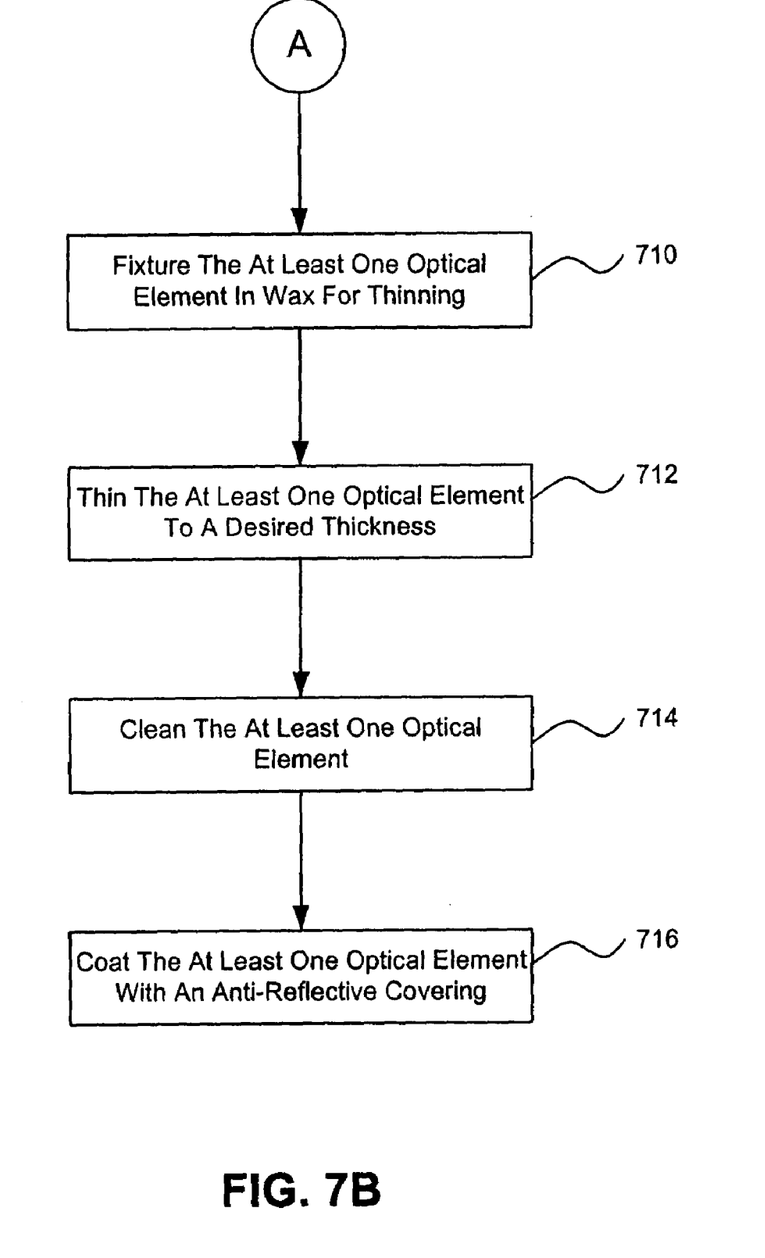

FIGS. 7A and 7B present a flowchart of a more detailed method 700 for manufacturing an ultra-thin high-precision optic according to an embodiment of the present invention. Method 700 has eight steps.

In step 702, a chrome pattern is disposed on a surface of a reticle blank. In an embodiment, the reticle blank is a commercially available 6"×6" reticle blank. The pattern is composed of several million geometrical shapes such as for example, squares, dots, gratings and/or other geometrical shapes randomly or pseudo-randomly distributed across the surface of the reticle blank. In embodiments, the number of geometric shapes of the pattern per unit area is varied to achieve a desired transmission or attenuation factor. The pattern is formed using a conventional reticle manufacturing processes.

In step 704, the patterned surface of the reticle blank is coated with a protective covering. In one embodiment, the protective covering is photoresist and enamel paint. Applying a thin 1 micron coating of photoresist (or enamel paint, optical tape, or wax) is typically sufficient to protect the pattern and glass from small chips and other debris produced during cutting and grinding of the reticle blank. The enamel paint is used to aid in fixturing the reticle blank in wax in step 706. Generally, wax will not stick to photoresist. Other covering can be used.

In step 706, the reticle blank is fixtured in wax. This is achieved by sinking the reticle blank in hot wax and allowing the wax to cool and harden.

In step 708, the reticle blank is saw cut, ground and/or milled to form several optical elements. These optical elements are formed to size, except for their axial thicknesses.

Depending on the setup and equipment used to cut and grind the reticle blank, the reticle blank and/or optical elements formed may have to be removed from the wax, cleaned, and refixtured one or more times in step 708 in order to properly size and finish each of the surfaces of the optical elements.

After step 708, the optical elements are preferably checked to verify they are within their required specifications prior to proceeding with step 710. In an embodiment, specifications which can be checked include the length, width, and end or side angles of the optical elements, plus optical properties. Additionally, the parallelism of the sides of the optical elements can be checked. Other specifications that can be checked for other embodiments will become apparent to persons skilled in the relevant art(s) given the description herein.

In step 710, the optical elements formed from the reticle blank are fixtured in wax for thinning. In an embodiment, several optical elements are fixtured together in a wax having a higher than normal melting point so that they can be thinned together in step 712. Fixturing multiple optical elements together helps improve the stiffness of the fixtured structure. The higher than normal melting point of the wax prevents the heat generated during thinning from softening and/or melting the wax. Thinning several optical elements together also helps ensure uniformity.

In step 712, the optical elements are thinned to a desired thickness. The optical elements are typically thinned to a thickness of 1,000 microns or less by grinding and polishing. In embodiments, the optical elements are thinned to a thickness on the order of 0.500 mm, 0.300 mm, 0.200 mm, 0.150 mm, or 0.100 mm. During thinning, wax can be removed from between the optical elements, while leaving sufficient wax to hold the optical elements, in order to facilitate polishing the optical elements to a final desired thickness. A surface plate and laser ruler are preferably used to verify the thickness of the optical elements.

In step 714, the optical elements are cleaned. The optical elements are preferably cleaned initially with diatomatious earth and a soapy solution such as Valtron while still fixtured. The optical elements are then removed from the fixture and cleaned with toluene and acetone, or other commercial solvents, to dissolve the wax. At this point, one can check the optical elements for flatness using an interferometer. The optical elements are also cleaned using an acid bath to remove organic materials including the photoresist coating applied in step 704. The optical elements are also cleaned with methanol in preparation for covering with an anti-reflective coat in step 716.

In step 716, the optical elements are coated with an anti-reflective coating. This coating improves the transmission of the optical elements.

In an embodiment, the optical elements are laid in a metal recess that matches the shape and thickness of the optical elements, and the anti-reflective coating is allowed to flow over the exposed surface of the optical elements. This process ensures a complete and uniform covering of each optical element. If a recess is not used, or if the depth of the recess does not match the thickness of the optical elements, the ends of the optical elements may not be properly coated.

As noted herein, various specifications are checked to ensure the optical elements perform as expected. The dimensions checked will depend on the shape and/or size of a particular optical element.

While various embodiments of the present invention have been described above, it should be understood that they have been presented by way of example only, and not limitation. It will be apparent to persons skilled in the relevant art(s) that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An optical element for attenuating light, comprising:
   a plurality of glass optics, each having a thickness between a first surface and a second surface of less than 1,000 microns, and each being individually movable in a plane normal to a thickness direction of the glass optics; and
   a pattern disposed on said first surface of each glass optic that attenuates light entering said glass optics at said first surface,
   wherein the plurality of glass optics are also moveable as a unit.

2. The optical element of claim 1, wherein said pattern comprises chrome.

3. The optical element of claim 1, wherein said pattern comprises a plurality of geometrical shapes.

4. The optical element of claim 3, wherein said plurality of geometrical shapes are disposed randomly over said first surface.

5. The optical element of claim 1, further comprising:
   an anti-reflective coating that covers said pattern.

6. The optical element of claim 1, wherein said attenuation is between five percent and twenty-five percent per unit area of the optical element.

7. An illumination attenuation system, comprising:
   a plurality of optical elements wherein each of said plurality of optical elements is separately movable in a plane to a thickness direction of the plurality of optical elements, and each comprises
      a glass optic having a thickness between a first surface and a second surface of less than 1,000 microns, and
      a pattern disposed on said first surface that attenuates light entering said glass optic at said first surface.

8. The system of claim 7, wherein said pattern comprises chrome.

9. The system of claim 7, wherein said pattern comprises a plurality of geometrical shapes.

10. The system of claim 9, wherein said plurality of geometrical shapes are disposed randomly over said first surface.

11. The system of claim 7, further comprising:
    an anti-reflective coating that covers said pattern.

12. The system of claim 7, wherein an attenuation of an optical element is between five percent and twenty-five percent per unit area of said optical element.

13. The system of claim 7, wherein the plurality of glass optics are also movable as a unit.

* * * * *